(12) United States Patent
Aoki et al.

(10) Patent No.: US 12,557,192 B2
(45) Date of Patent: Feb. 17, 2026

(54) SEMICONDUCTOR DEVICE, SWITCHING POWER SUPPLY, AND LIGHTING DEVICE

(71) Applicant: ROHM CO., LTD., Kyoto (JP)

(72) Inventors: Akira Aoki, Kyoto (JP); Ryo Takagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 125 days.

(21) Appl. No.: 18/397,488

(22) Filed: Dec. 27, 2023

(65) Prior Publication Data

US 2024/0130018 A1 Apr. 18, 2024

Related U.S. Application Data

(63) Continuation of application No. PCT/JP2022/026940, filed on Jul. 7, 2022.

(30) Foreign Application Priority Data

Jul. 20, 2021 (JP) ................. 2021-119416

(51) Int. Cl.
*H05B 45/3725* (2020.01)
*H05B 45/32* (2020.01)
(Continued)

(52) U.S. Cl.
CPC ......... *H05B 45/3725* (2020.01); *H05B 45/32* (2020.01); *H05B 45/34* (2020.01); *H05B 45/345* (2020.01); *H05B 45/50* (2020.01)

(58) Field of Classification Search
CPC .... H05B 45/3725; H05B 45/32; H05B 45/34; H05B 45/345; H05B 45/50; H05B 45/14; H02M 3/155

See application file for complete search history.

(56) References Cited

U.S. PATENT DOCUMENTS

| | | | |
|---|---|---|---|
| 2014/0265935 A1* | 9/2014 | Sadwick | H05B 45/56 |
| | | | 315/307 |
| 2015/0200593 A1* | 7/2015 | Stoichita | H02M 3/158 |
| | | | 323/271 |
| 2017/0288434 A1* | 10/2017 | Narita | H02M 1/08 |

FOREIGN PATENT DOCUMENTS

| | | | | |
|---|---|---|---|---|
| EP | 0436980 A1 * | 7/1991 | | H02M 1/4225 |
| JP | H05-011864 | 1/1993 | | |

(Continued)

OTHER PUBLICATIONS

International Search Report and Written Opinion in International Appln. No. PCT/JP2022/026940, mailed on Sep. 20, 2022, 22 pages (with machine translation).

*Primary Examiner* — Abdullah A Riyami
*Assistant Examiner* — Syed M Kaiser
(74) *Attorney, Agent, or Firm* — Fish & Richardson P.C.

(57) ABSTRACT

For example, a semiconductor device disclosed in the present description is configured to function as a component of a switching power supply, and includes: a current sense signal generator configured to generate a current sense signal by amplifying a sense voltage corresponding to the output current of the switching power supply; a voltage sense signal generator configured to generate a voltage sense signal corresponding to the output voltage of the switching power supply; a selector configured to output as a selected sense signal one of the current sense signal and the voltage sense signal according to a mode switch signal; and an output feedback controller configured to control the driving of the switching power supply based on the selected sense signal.

10 Claims, 10 Drawing Sheets

(51) Int. Cl.
    *H05B 45/34*         (2020.01)
    *H05B 45/345*       (2020.01)
    *H05B 45/50*         (2022.01)

(56) References Cited

FOREIGN PATENT DOCUMENTS

| | | | |
|---|---|---|---|
| JP | 2009030834 A | * | 2/2009 |
| JP | 2010-063333 | | 3/2010 |
| JP | 2010-187496 | | 8/2010 |
| JP | 2010187496 A | * | 8/2010 |
| JP | 2012-161146 | | 8/2012 |
| JP | 2015-091206 | | 5/2015 |
| JP | 2015-146711 | | 8/2015 |
| JP | 2017-184598 | | 10/2017 |
| JP | 2020-198217 | | 12/2020 |
| JP | 2021-044283 | | 3/2021 |

* cited by examiner

SEMICONDUCTOR DEVICE, SWITCHING POWER SUPPLY, AND LIGHTING DEVICE

CROSS-REFERENCE TO RELATED APPLICATIONS

This nonprovisional application is a continuation application of International Patent Application No. PCT/JP2022/026940 filed on Jul. 7, 2022, which claims priority Japanese Patent Application No. 2021-119416 filed on Jul. 20, 2021, the entire contents of which are hereby incorporated by reference.

TECHNICAL FIELD

The invention disclosed herein relates to semiconductor devices, and also relates to switching power supplies and lighting devices that employ semiconductor devices.

BACKGROUND ART

Semiconductor devices (e.g., LED [light-emitting diode] driver ICs or power controller ICs) that function as a component of a switching power supply are widely in practical use.

An example of known technology related to what is mentioned above is seen in Patent Document 1 identified below.

CITATION LIST

Patent Literature

Patent Document 1: JP-A-2020-198217

DESCRIPTION OF EMBODIMENTS

LED Lighting Device (First Comparative Example)

Figure 1:
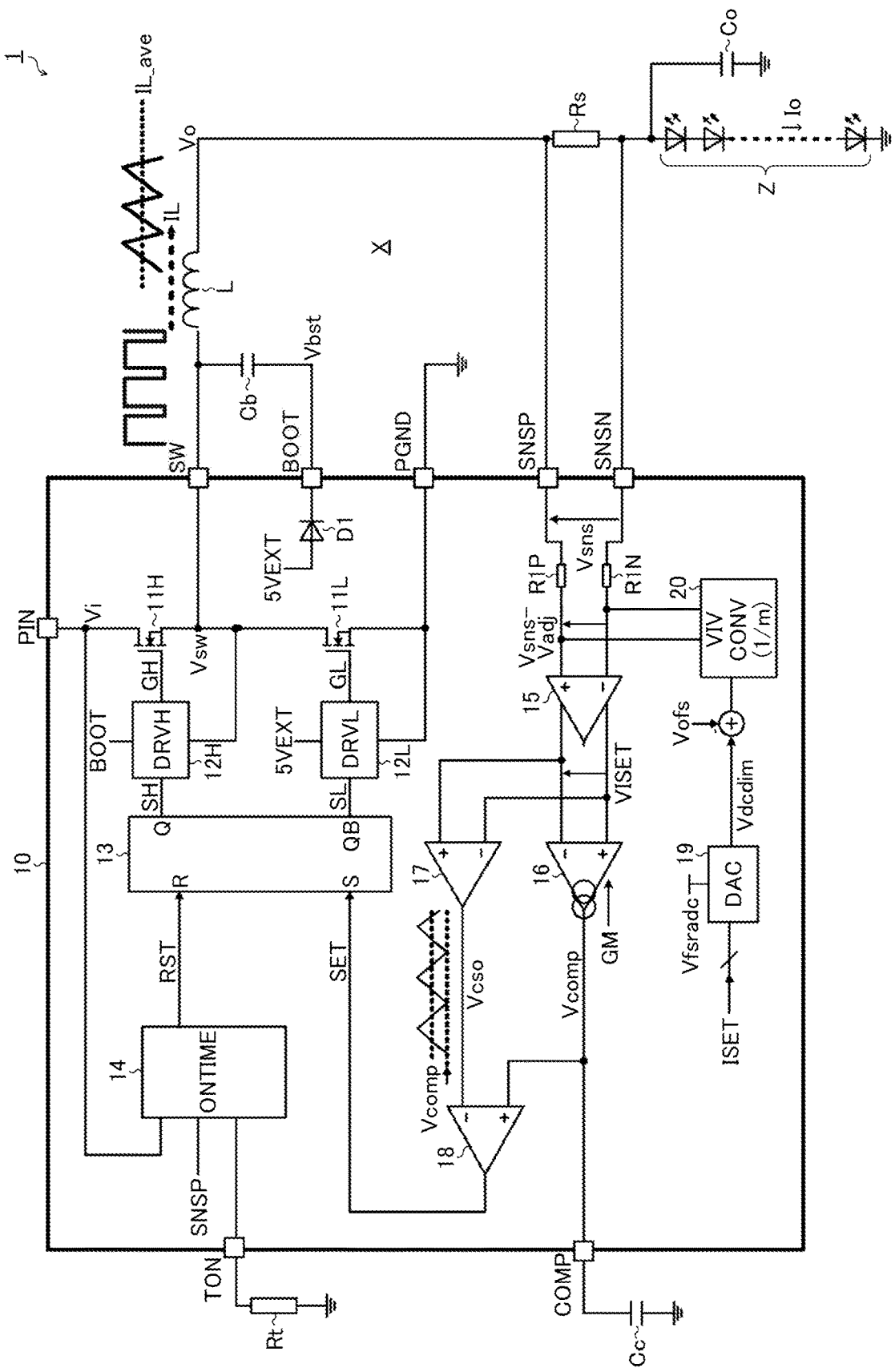
FIG. 1 is a diagram showing an LED lighting device of a first comparative example.

FIG. 1 is a diagram showing an LED lighting device of a first comparative example (a basic configuration for comparison with the embodiments described later). The LED lighting device 1 of the first comparative example includes a switching power supply X and an LED load Z (i.e., one example of a light-emitting element that emits light by being supplied with the output current Io of the switching power supply X; in the diagram, a plurality of light-emitting elements connected in series). The switching power supply X is composed of an LED driver IC 10 and various discrete components externally connected to it (capacitors Cb, Cc, and Co, an inductor L, a resistor Rt, and a sense resistor Rs).

The LED driver IC 10 is a semiconductor device that functions as one component of the switching power supply X that supplies the LED load Z with electric power by bucking (stepping down) an input voltage Vi from a power system. The LED driver IC 10 has, as a means for establishing electrical connection with outside the IC, a plurality of external terminals (a PIN pin, a SW pin, a BOOT pin, a PGND pin, a SNSP pin, a SNSN pin, a TON pin, a COMP pin, and the like).

The PIN pin is a power-system power terminal. The SW pin is a switching output terminal. The BOOT pin is a terminal for connection of a bootstrap capacitor for driving a high-side gate. The PGND pin is a power-system ground terminal. The SNSP pin is a first current sense terminal (+). The SNSN pin is a second current sense terminal (−). The TON pin is a terminal for connection of a resistor for setting an on-time. The COMP pin is a terminal for connection of a capacitor for phase compensation.

The PIN pin is connected to a power terminal of the power system (i.e., an application terminal for the input voltage Vi). The SW pin is connected to the first terminal of the inductor L. The second terminal of the inductor L is connected to the first terminal of the sense resistor Rs. The second terminal of the sense resistor Rs is connected to the anode of the LED load Z. The cathode of the LED load Z is connected to a ground terminal. Between the BOOT pin and the SW pin, the capacitor Cb (bootstrap capacitor) is connected. Between the anode of the LED load Z and the ground terminal, the capacitor Co (output capacitor) is connected. The first terminal (high-potential terminal) of the sense resistor Rs is connected to the SNSP pin. The second terminal (low-potential terminal) of the sense resistor Rs is connected to the SNSN pin. The PGND pin is connected to the ground terminal of the power system. Between the TON pin and the ground terminal, the resistor Rt (on-time setting resistor) is connected. Between the COMP pin and the ground terminal, the capacitor Cc (phase compensation capacitor) is connected.

Incidentally, the inductor L and the capacitor Co mentioned above constitute, along with a high-side switch 11H and a low-side switch 11L (of which details will be given later) incorporated in the LED driver IC 10, a bucking output stage of the switching power supply X so as to rectify and smooth a switching voltage Vsw with a rectangular waveform output from the SW pin of the LED driver IC 10 to produce an output voltage Vo.

LED Driver IC (First Comparative Example)

Referring still to FIG. 1, the circuit configuration of the LED driver IC 10 will be described in detail. The LED driver IC 10 of the first comparative example incorporates, as a means for driving the LED load Z, a high-side switch 11H, a low-side switch 11L, a high-side driver 12H, a low-side driver 12L, a controller 13, an on-time setter 14, a current sense amplifier 15, an error amplifier 16, a slope signal generator 17, a comparator 18, a DAC (digital-to-analog converter) 19, a V-I converter 20, a bootstrap diode D1, and input resistors R1P and R1N. Needless to say, the LED driver IC 10 may have integrated in it any additional circuit elements (such as a temperature sensing circuit or various protection circuits) other than those enumerated above.

The high-side switch 11H is connected between the PIN and SW pins, and is turned on and off according to a high-side gate signal GH. The high-side switch 11H can be suitably implemented with an NMOSFET (N-channel metal-oxide-semiconductor field-effect transistor) or the like. In that case, the high-side switch 11H is on when GH=H (=BOOT), and is off when GH=L (=SW). The high-side switch 11H may be implemented with, instead of an NMOSFET, a PMOSFET (P-channel MOSFET). In that case, the bootstrap diode D1, the capacitor Cb, and the BOOT pin can be omitted.

The low-side switch 11L is connected between the SW and PGND pins, and is turned on and off according to a low-side gate signal GL. The low-side switch 11L can be suitably implemented with an NMOSFET or the like. In that case, the low-side switch 11L is on when GL=H (=5VEXT), and is off when GL=L (=PGND).

So connected, the high-side and low-side switches 11H and 11L constitute a half-bridge output stage (i.e., part of the bucking output stage of the switching power supply X) that outputs the switching voltage Vsw with a rectangular waveform from the SW pin. Thus, the high-side switch 11H corresponds to an output element, and the low-side switch 11L corresponds to a synchronous rectifying element. Note here that the inductor L, the sense resistor Rs, and the LED load Z mentioned above are connected in series with the high-side switch 11H. While the diagram shows a half-bridge output stage that employs synchronous rectification, diode rectification may be employed instead, in which case a diode can be used as the low-side switch 11L. The high-side and low-side switches 11H and 11L may be connected externally to the LED driver IC 10.

The high-side driver 12H generates the high-side gate signal GH based on a high-side control signal SH fed from the controller 13. The high level of the high-side gate signal GH equals a boost voltage Vbst (≈Vsw+5VEXT) that appears at the BOOT pin. On the other hand, the low level of the high-side gate signal GH equals the switching voltage Vsw that appears at the SW pin.

The low-side driver 12L generates the low-side gate signal GL based on a low-side control signal SL fed from the controller 13. The high level of the low-side gate signal GL equals a constant voltage 5VEXT (an internal supply voltage, or a voltage fed in from outside). On the other hand, the low level of the low-side gate signal GL equals the terminal voltage at the PGND pin (i.e., the ground voltage of the power system).

The controller 13 includes, for example, an RS flip-flop that receives a set signal SET and a reset signal RST, and generates the high-side and low-side control signals SH and SL so as to turn on and off the high-side and low-side switches 11H and 11L complementarily.

More specifically, the controller 13 generates the high-side and low-side control signals SH and SL so as to turn the high-side switch 11H on and the low-side switch 11L off at a rising timing of the set signal SET and to turn the high-side switch 11H off and the low-side switch 11L on at a rising timing of the reset signal RST.

Note that, in the present description, the term "complementarily" is to be understood broadly to cover not only operation in which the on/off states of the high-side and low-side switches 11H and 11L are completely reversed but also operation in which a simultaneously-off period (what is called a dead time) is provided to prevent a through current.

The on-time setter 14 turns the reset signal RST to high level at the lapse of a predetermined on-time Ton after the rising timing of the set signal SET (hence the on-timing of the high-side switch 11H). The on-time setter 14 has a function of freely setting the on-time Ton according to the resistance value of the resistor Rt connected to the TON pin. The on-time setter 14 also has a function of varying the on-time Ton so as to reduce variation of the switching frequency Fsw based on the terminal voltages at the PIN and SNSP (or SNSN) pins.

The current sense amplifier 15 is a differential output amplifier provided with a floating input stage that can amplify the input signal on a rail-to-rail basis. Here, "floating" denotes floating off the ground potential (being potentially isolated from it).

The non-inverting input terminal (+) of the current sense amplifier 15 is connected to the first terminal of the input resistor R1P (e.g., 10 kΩ). The second terminal of the input resistor R1P is connected to the SNSP pin. The inverting input terminal (−) of the current sense amplifier 15 is connected to the first terminal of the input resistor R1N (e.g., 10 kΩ). The second terminal of the input resistor R1N is connected to the SNSN pin. To the non-inverting input terminal (+) and the inverting input terminal (−) of the current sense amplifier 15 is also connected the V-I converter 20.

So connected, the current sense amplifier 15 functions as a current sense signal generator that generates a current sense signal VISET in a differential form by amplifying the difference (=Vsns−Vadj) between a current adjustment voltage Vadj, which is scaled, and a sense voltage Vsns. The current sense signal VISET increases (positive voltage) when the average value of the output current Io through the sense resistor Rs (i.e., average inductor current IL_ave) is higher than a set current value (corresponding to the target value of the output current Io), and decreases (negative voltage) when the average value of the output current Io is lower than the set current value. In this way, if the output current Io is lower than the target value, the current sense signal VISET, which is in a differential form, inverts its polarity.

The error amplifier 16 outputs a current according to the current sense signal VISET in a differential form; it generates an error signal Vcomp by charging and discharging the phase compensation capacitor Cc externally connected to the COMP pin. The error signal Vcomp rises when the current sense signal VISET is a negative voltage, and falls when the current sense signal VISET is a positive voltage. The transconductance gm of the error amplifier 16 may be variable according to a register value GM.

The slope signal generator 17 generates, from the current sense signal VISET (or the sense voltage Vsns), a slope signal Vcso that contains an alternating-current component of the output current Io (i.e., the ripple component of the inductor current IL). The slope signal Vcso has a triangular waveform and has the error signal Vcomp as its bottom value, increasing as the inductor current IL increases and decreasing as the inductor current IL decreases.

The comparator 18 generates the set by comparing the slope signal Vcso, which is fed to the inverting input terminal (−) of the comparator 18, with the error signal Vcomp, which is fed to the non-inverting input terminal (+) of the comparator 18. The set signal SET is at low level when Vcomp<Vcso, and is at high level when Vcomp>Vcso. Accordingly, the lower the error signal Vcomp, the later the rising timing of the set signal SET (hence the on-timing of the high-side switch 11H) and, the higher the error signal Vcomp, the earlier the rising timing of the set signal SET. This comparison operation by the comparator 18 is equivalent to bottom detection operation valley detection operation) with respect to the inductor current IL.

The DAC 19 converts an n-bit (e.g., n=10) digital dimming signal ISET into an analog dimming signal Vdcdim (corresponding to an output setting signal). Here the digital dimming signal ISET is a digital register value that is set from outside the LED driver IC 10 via any interface (such as an SPI [serial peripheral interface]). The analog dimming signal Vdcdim is a voltage signal that varies in a predetermined range (0 to Vfsradc, where Vfsradc is the supply voltage for the DAC 19) according to the digital dimming signal ISET.

The V-I converter 20 corresponds to a sense voltage adjuster that adjusts the sense voltage Vsns according to the analog dimming signal Vdcdim. In terms of what is shown in the diagram, the V-I converter 20 converts the analog dimming signal Vdcdim into a current signal and, using this current signal, adjusts the currents that pass through the input resistors R1P and R1N respectively. As a result, a current adjustment voltage Vadj (=Vdcdim/m) corresponding to the analog dimming signal Vdcdim is subtracted from the sense voltage Vsns. The analog dimming signal Vdcdim may have added to it any offset signal Vofs (e.g., minus several hundred volts) in a stage preceding the V-I converter 20.

Of the circuit elements mentioned above, the high-side and low-side drivers 12H and 12L, the controller 13, the on-time setter 14, the current sense amplifier 15, the error amplifier 16, the slope signal generator 17, and the comparator 18 function as an output feedback controller employing a bottom-detection fixed-on-time scheme. By this output feedback controller the high-side and low-side switches 11H and 11L are driven complementarily such that the output current Io supplied from the SW pin to the LED load Z is equal to a predetermined target value.

<Output Feedback Control (Constant-Current Control)>

Figure 2:
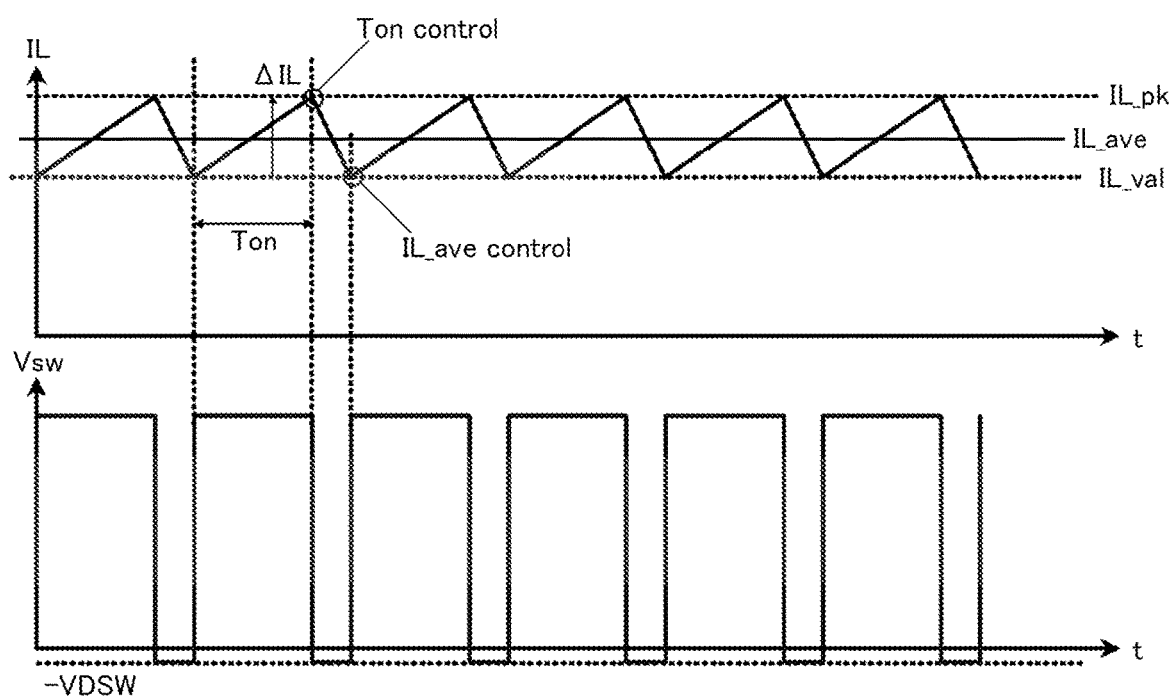
FIG. 2 is a diagram showing bottom-detection fixed-on-time output feedback control (constant-current control).

FIG. 2 is a diagram showing the bottom-detection fixed-on-time output feedback control (constant-current control) by the LED driver IC 10 of the first comparative example, depicting, from top down, the inductor current IL and the switching voltage Vsw.

With the high-side switch 11H off and the low-side switch 11L on, the switching voltage Vsw is at low level (equal to the negative voltage appearing between the drain and the source of the low-side switch 11L minus VDSW). In this state, the inductor current IL passing from the PGND pin through the low-side switch 11L to the SW pin decreases as the inductor L discharges energy.

When the inductor current IL falls down to the bottom value IL_val corresponding to the error signal Vcomp, then Vcomp>Vcso and the set signal SET rises to high level. As a result, the high-side switch 11H turns on and the low-side switch 11L turns off. Now, the switching voltage Vsw is at high level (≈Vi), and thus the inductor current IL passing from the PIN pin through the high-side switch 11H to the SW pin increases.

At the lapse of the predetermined on-time Ton after that, the reset signal RST rises to high level. Thus, the high-side switch 11H turns off and the low-side switch 11L turns on, causing the inductor current IL to cease increasing and start decreasing again. As a result, the inductor current IL has a ripple waveform repeatedly increasing and decreasing between the peak value IL_pk and the bottom value IL_val.

Here, the average value of the output current Io (i.e., the average inductor current IL_ave) is variably controlled according to the analog dimming signal Vdcdim. On the other hand, the ripple amplitude ΔIL (=IL_pk−IL_val) of the inductor current IL is determined according to the on-time Ton.

Thus, through repetition of the sequence of operation described above, in the LED driver IC 10, bottom-detection fixed-on-time output feedback control (constant-current control) is performed such that the average inductor current IL_ave (hence the average value of the inductor current IL) is equal to a predetermined target value.

The topology for the output feedback control in the LED driver IC 10 is not limited to the one described above: instead of a bottom-detection fixed-on-time scheme, a peak-detection fixed-off-time scheme may be employed, or a hysteresis-window scheme may be employed. In applications that do not require very fast response, a linear control scheme such as a PWM (pulse-width modulation) control scheme may be employed.

<Dimming Control>

Figure 3:
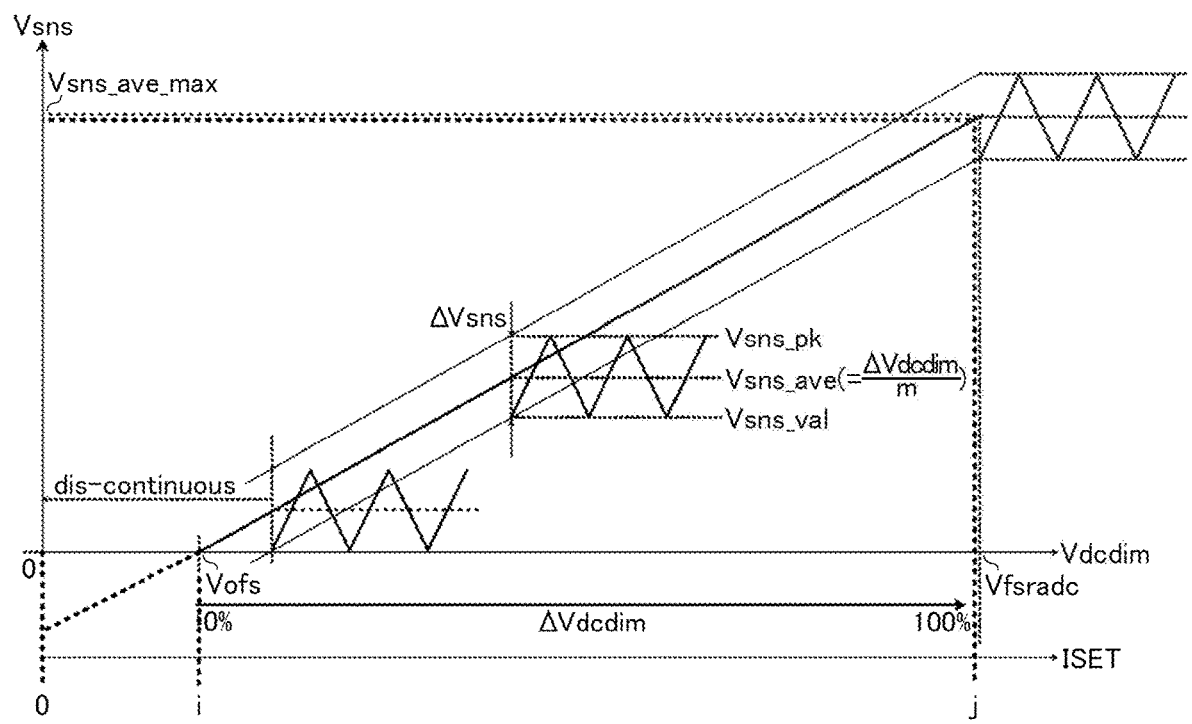
FIG. 3 is a diagram showing one example of dimming control.

FIG. 3 is a diagram showing one example of dimming control by the LED driver IC 10 of the first comparative example. In the diagram, along the horizontal axis are depicted the digital dimming signal ISET and the analog dimming signal Vdcdim, and the vertical axis represents the sense voltage Vsns.

The digital dimming signal ISET is set in the range of 0≤ISET≤j (e.g., j=1023). On the other hand, according to the digital dimming signal ISET, the analog dimming signal Vdcdim varies in the range of 0≤Vdcdim≤Vfsradc (e.g., 2.5 V). Moreover, the average value Vsns_ave of the sense voltage Vsns is variably controlled in the range of 0≤Vsns_ave≤Vsns_ave_max (e.g., 191.5 mV) according to the offset analog dimming signal ΔVdcdim (=Vdcdim−Vofs).

Note that, when 0≤ISET≤i (e.g., i=82), the offset analog dimming signal ΔVdcdim (=Vdcdim−Vofs) is equal to or less than 0 V. Accordingly, in the LED driver IC 10, dimming control for the LED load Z is performed such that, when ISET=i (i.e., Vdcdim=Vofs), the dimming ratio is 0% and that, when ISET=j (i.e., Vdcdim=Vfsradc), the dimming ratio is 100%.

Note that the sense voltage Vsns has a ripple waveform repeatedly increasing and decreasing between a peak value Vsns_pk and a bottom value Vsns_val. When Vsns_val<0, operation proceeds in a discontinuous current mode.

LED Lighting Device (Second Comparative Example)

Figure 4:
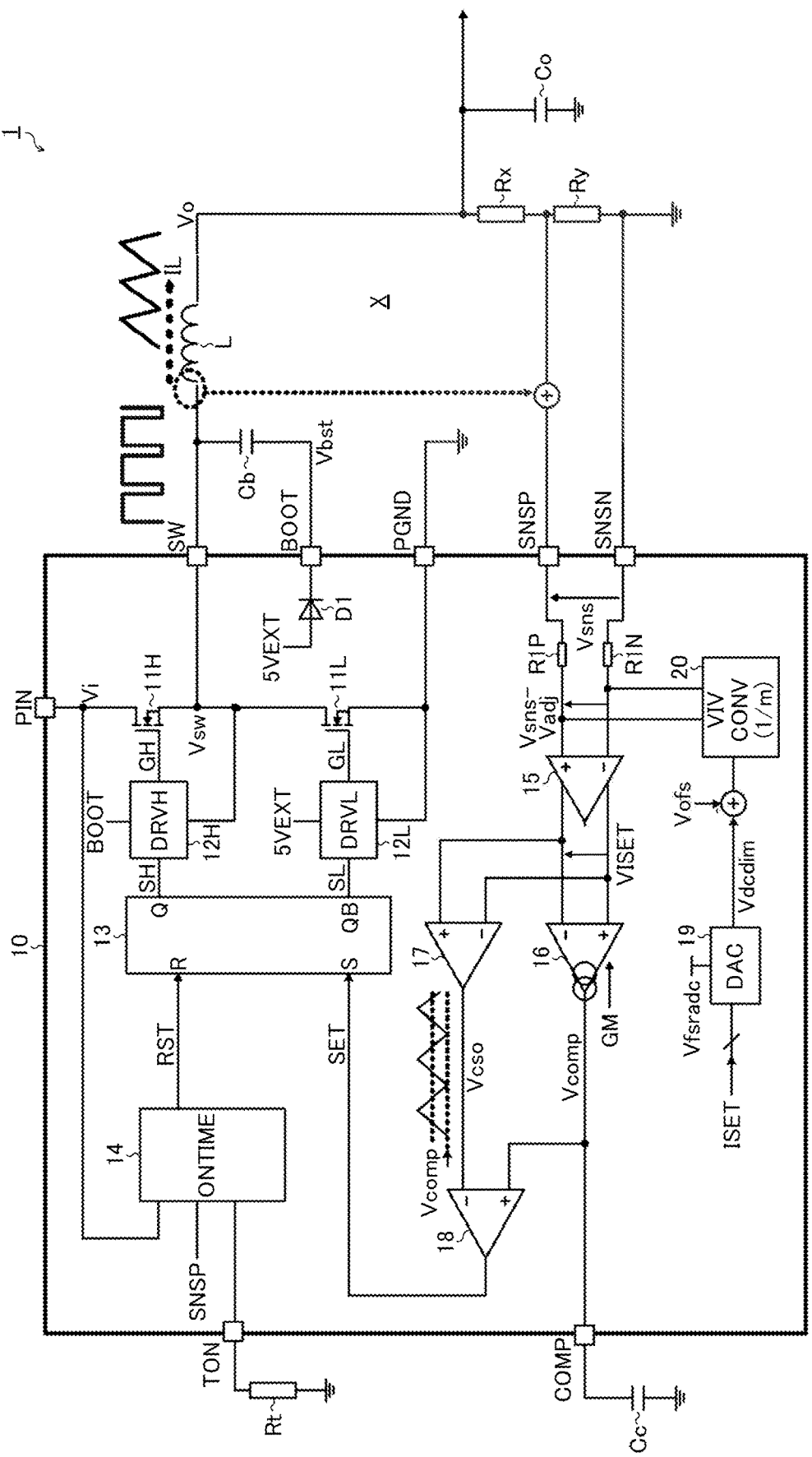
FIG. 4 is a diagram showing an LED lighting device of a second comparative example.

FIG. 4 is a diagram showing an LED lighting device of a second comparative example. The LED lighting device 1 of the second comparative example is based on the first comparative example (FIG. 1) described previously, but differs from it in that the discrete components externally connected to the LED driver IC 10 are modified such that, instead of constant-current control on the output current Io as described above, constant-voltage control is performed on the output voltage Vo.

In terms of what is shown in the diagram, in the LED lighting device 1 of the second comparative example, in place of the sense resistor Rs described previously, resistors Rx and Ry are externally connected to the LED driver IC 10. The first terminal of the resistor Rx is connected to an application terminal for the output voltage Vo. The second terminal of the resistor Rx and the first terminal of the resistor Ry are both connected to the SNSP pin of the LED driver IC 10. The second terminal of the resistor Ry and the SNSN pin of the LED driver IC 10 are both connected to a ground terminal.

With the configuration described above, the sense voltage Vsns applied between the SNSP and SNSN pins of the LED driver IC 10 has a voltage value (=[Ry/(Rx+Ry)]×Vo) corresponding to the output voltage Vo. Thus, with no change in the internal configuration of the LED driver IC 10, it is possible to achieve constant-voltage control of the output voltage Vo.

Note however that, owing to the LED driver IC 10 employing a current-mode bottom-detection fixed-on-time scheme as the topology for output feedback control, not only when constant-current control is performed on the output current Io but also when constant-voltage control is performed on the output voltage Vo, it is necessary to sense the alternating-current component of the output current Io (i.e., the ripple component of the inductor current IL).

Inconveniently, the sense voltage Vsns extracted from across the resistor Ry does not contain the desired current information. Thus, the LED lighting device 1 of the second comparative example additionally requires, as indicated by a broken line, a feedforward circuit for adding the alternating-current component of the output current Io (i.e., the ripple component of the inductor current IL) to the sense voltage Vsns.

Another possible method is to sense the inductor current IL passing through the high-side or low-side switch 11H or 11L within the LED driver IC 10. This method does not require a feedforward circuit and thus helps reduce the number of components. This, however, is not necessarily the best solution because, if noise is applied to the PGND pin of the LED driver IC 10, it may adversely affect the current sensing operation within the IC. In particular, in a case where the LED driver IC 10 has a plurality of output channels, noise is more likely to be applied to the PGND pin, making the just-mentioned problem more noticeable.

In view of the above problem, presented below will be a novel embodiment that allows free switching of the target of output feedback control (e.g., an output current Io or output voltage Vo) in a switching power supply X.

LED Lighting Device (First Embodiment)

Figure 5:
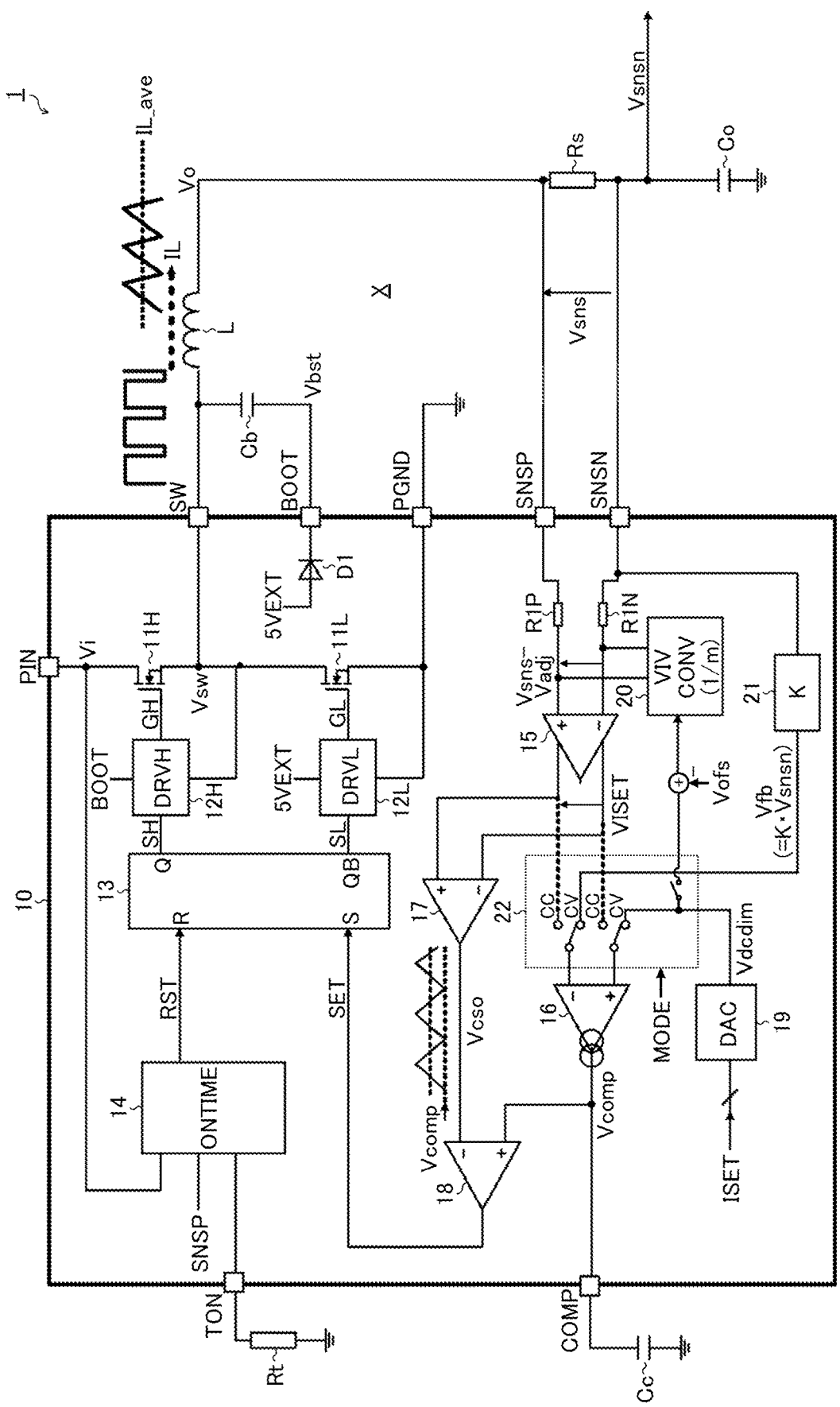
FIG. 5 is a diagram showing an LED lighting device according to a first embodiment.

FIG. 5 is a diagram showing an LED lighting device according to a first embodiment. The LED lighting device 1 of the first embodiment is based on the first comparative example (FIG. 1) described previously, and additionally includes, as circuit elements of the LED driver IC 10, a voltage divider 21 and a selector 22. Accordingly, such circuit elements as have already been described will be identified by the same reference signs as in FIG. 1, and no overlapping description will be repeated. The following description focuses on the features peculiar to the first embodiment.

The voltage divider 21 divides the terminal voltage Vsnsn (≈the output voltage Vo) at the SNSN pin by a predetermined division factor K (where 0<K<, e.g., K=1/27) to generate a voltage sense signal Vfb (=K·Vsnsn). Thus, the voltage divider 21 functions as a voltage sense signal generator that generates a voltage sense signal Vfb corresponding to the output voltage Vo of the switching power supply X.

According to a mode switch signal MODE, the selector 22 outputs one of the current sense signal VISET and the voltage sense signal Vfb, as a selected sense signal, to the error amplifier 16. Thus, according to the selected sense signal output from the selector 22, the error amplifier 16 generates the error signal Vcomp. That is, in the output feedback controller, based on the selected sense signal output from the selector 22, the driving of the switching power supply X is controlled. The selector 22 also has a function of switching, according to the mode switch signal MODE, the output destination of the analog dimming signal Vdcdim between the error amplifier 16 and the V-I converter 20.

Specifically, in a constant-current control mode (MODE=CC), the analog dimming signal Vdcdim is fed to the V-I converter 20 and the current sense signal VISET in a differential form is fed, as the selected sense signal, to the error amplifier 16.

On the other hand, in a constant-voltage control mode (MODE=CV), as shown in the diagram, the voltage sense signal Vfb is fed to the inverting input terminal (−) of the error amplifier 16, and the analog dimming signal Vdcdim is fed to the non-inverting input terminal (+) of the error amplifier 16.

The slope signal generator 17 is fed with the current sense signal VISET all the time regardless of the mode switch signal MODE. That is, a current ripple sense path (high-speed path) is shared between the constant-current control mode (MODE=CC) and the constant-voltage control mode (MODE=CV).

As described above, with the LED lighting device 1 according to the first embodiment, it is possible to switch, according to the mode switch signal MODE, between an output feedback loop for the constant-current control mode (MODE=CC) and an output feedback loop for the constant-voltage control mode (MODE=CV) within the LED driver IC 10. It is thus possible to freely change the target of output feedback control (the output current Io or the output voltage Vo) in the switching power supply X with no change in the discrete components externally connected to the LED driver IC 10.

The output feedback control in the constant-current control mode (MODE=CC) is as described previously in connection with the first comparative example (FIG. 2). Accordingly, no overlapping description will be repeated and the following description gives details of the output feedback control in the constant-voltage control mode (MODE=CV).

<Output Feedback Control (Constant-Voltage Control)>

Figure 6:
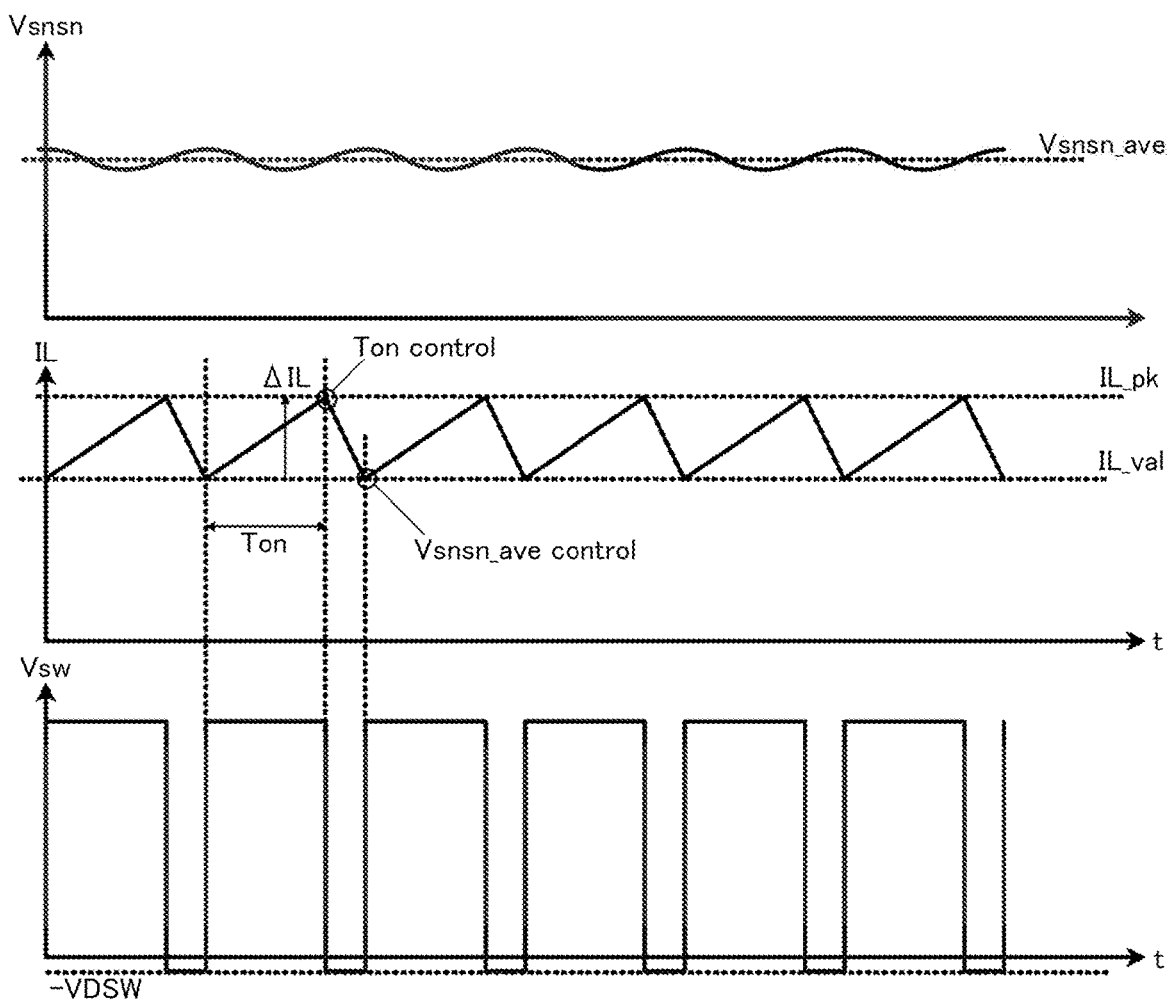
FIG. 6 is a diagram showing bottom-detection fixed-on-time output feedback control (constant-voltage control).

FIG. 6 is a diagram showing the bottom-detection fixed-on-time output feedback control (constant-voltage control) by the LED driver IC 10 according to the first embodiment, depicting, from top down, the terminal voltage Vsnsn (≈the output voltage Vo), the inductor current IL, and the switching voltage Vsw.

With the high-side switch 11H off and the low-side switch 11L on, the switching voltage Vsw is at low level (=the negative voltage appearing between the drain and the source of the low-side switch 11L minus VDSW). In this state, the inductor current IL passing from the PGND pin via the low-side switch 11L to the SW pin decreases as the inductor L discharges energy.

When the inductor current IL falls down to the bottom value IL_val corresponding to the error signal Vcomp, then Vcomp>Vcso and the set signal SET rises to high level. As a result, the high-side switch 11H turns on and the low-side switch 11L turns off. Now, the switching voltage Vsw is at high level (≈Vi), and thus the inductor current IL passing from the PIN pin through the high-side switch 11H to the SW pin increases.

At the lapse of the predetermined on-time Ton after that, the reset signal RST rises to high level. Thus, the high-side switch 11H turns off and the low-side switch 11L turns on, causing the inductor current IL to cease increasing and start decreasing again. As a result, the inductor current IL has a ripple waveform repeatedly increasing and decreasing between the peak value IL_pk and the bottom value IL_val.

Here, the bottom value IL_val of the inductor current IL is determined according to the average value of the terminal voltage Vsnsn fed to the SNSN pin (i.e., the average terminal voltage Vsnsn_ave). On the other hand, the ripple amplitude ΔIL (=IL_pk−IL_val) of the inductor current IL is determined according to the on-time Ton.

Thus, through repetition of the sequence of operation described above, in the LED driver IC 10, bottom-detection fixed-on-time output feedback control (constant-voltage control) is performed such that the average terminal voltage Vsnsn_ave (hence the average value of the output voltage Vo) is equal to a predetermined target value.

LED Lighting Device (Second Embodiment)

Figure 7:
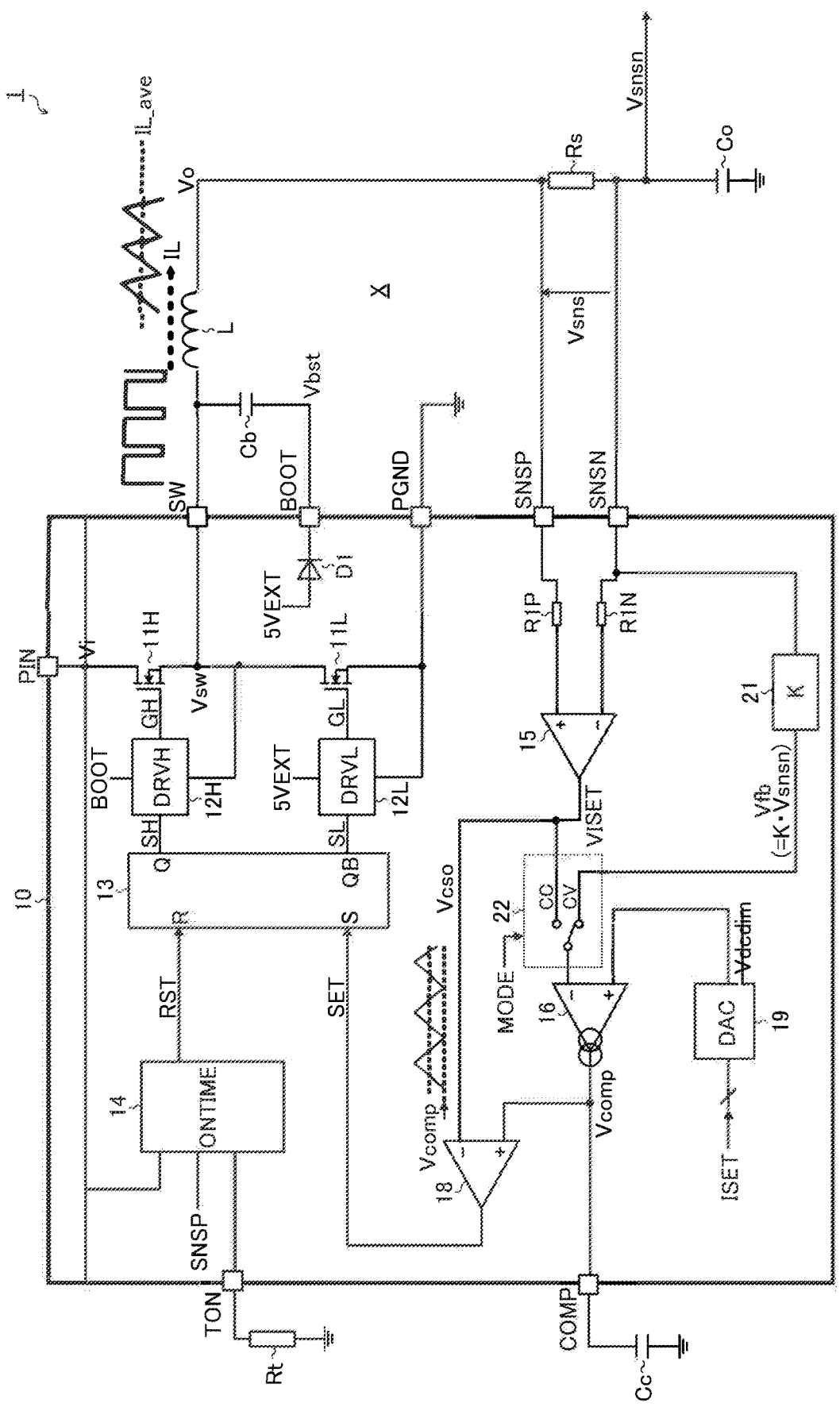
FIG. 7 is a diagram showing an LED lighting device according to a second embodiment.

FIG. 7 is a diagram showing an LED lighting device according to a second embodiment. The LED lighting device 1 of the second embodiment is based on the first embodiment (FIG. 5) described previously, but differs from it in that the LED driver IC 10 has a modified internal configuration. In terms of what is shown in the diagram, the slope signal generator 17 and the V-I converter 20 described previously are omitted, and the current sense amplifier 15 is modified from a differential output type to a single output type. Also, to accommodate these modifications, the interconnections among the circuit elements are modified.

For example, according to the mode switch signal MODE, the selector 22 feeds one of the current sense signal VISET and the voltage sense signal Vfb, as the selected sense signal, to the inverting input terminal (−) of the error amplifier 16. Specifically, in the constant-current control mode (MODE=CC), the current sense signal VISET is fed as the selected sense signal to the inverting input terminal (−) of the error amplifier 16. By contrast, in the constant-voltage control mode (MODE=CV), as shown in the diagram, the voltage sense signal Vfb is fed to the inverting input terminal (−) of the error amplifier 16.

The non-inverting input terminal (+) of the error amplifier 16 is fed with the analog dimming signal Vdcdim all the time. While the diagram deals with an example where the DAC 19 is used to convert the digital dimming signal ISET into the analog dimming signal Vdcdim, instead an external terminal for receiving input of the analog dimming signal Vdcdim from outside may be additionally provided. It is also possible allow switching between input of the digital dimming signal ISET from outside and input of the analog dimming signal Vdcdim from outside.

Thus, the error amplifier 16 outputs a current corresponding to the difference between the analog dimming signal Vdcdim, which is fed to the non-inverting input terminal (+) of the error amplifier 16, and the selected sense signal (i.e., the current sense signal VISET or the voltage sense signal Vfb), which is fed to the inverting input terminal (−) of the error amplifier 16; it thereby charges and discharges the capacitor Cc to generate the error signal Vcomp. The error signal Vcomp rises when VISET<Vdcdim or Vfb<Vdcdim, and falls when VISET>Vdcdim or Vfb>Vdcdim.

The inverting input terminal (−) of the comparator 18 is fed with, as the slope signal Vcso, the current sense signal VISET all the time irrespective of the mode switch signal MODE. That is, the current ripple sense path (high-speed path) is shared between the constant-current control mode (MODE=CC) and the constant-voltage control mode (MODE=CV).

With the LED lighting device 1 of the second embodiment, as with that of the first embodiment (FIG. 5), it is possible to switch, according to the mode switch signal MODE, between an output feedback loop for the constant-current control mode (MODE=CC) and an output feedback loop for the constant-voltage control mode (MODE=CV) within the LED driver IC 10. It is thus possible to freely change the target of output feedback control (the output current Io or the output voltage Vo) in the switching power supply X with no change in the discrete components externally connected to the LED driver IC 10.

The output feedback control in the constant-current control mode (MODE=CC) is as described previously in connection with the first comparative example (FIG. 2). On the other hand, the output feedback control in the constant-voltage control mode (MODE=CV) is as described previously in connection with the first embodiment (FIG. 6). Accordingly, no overlapping description will be repeated for the output feedback control in either mode.

LED Lighting Device (Third Embodiment)

Figure 8:
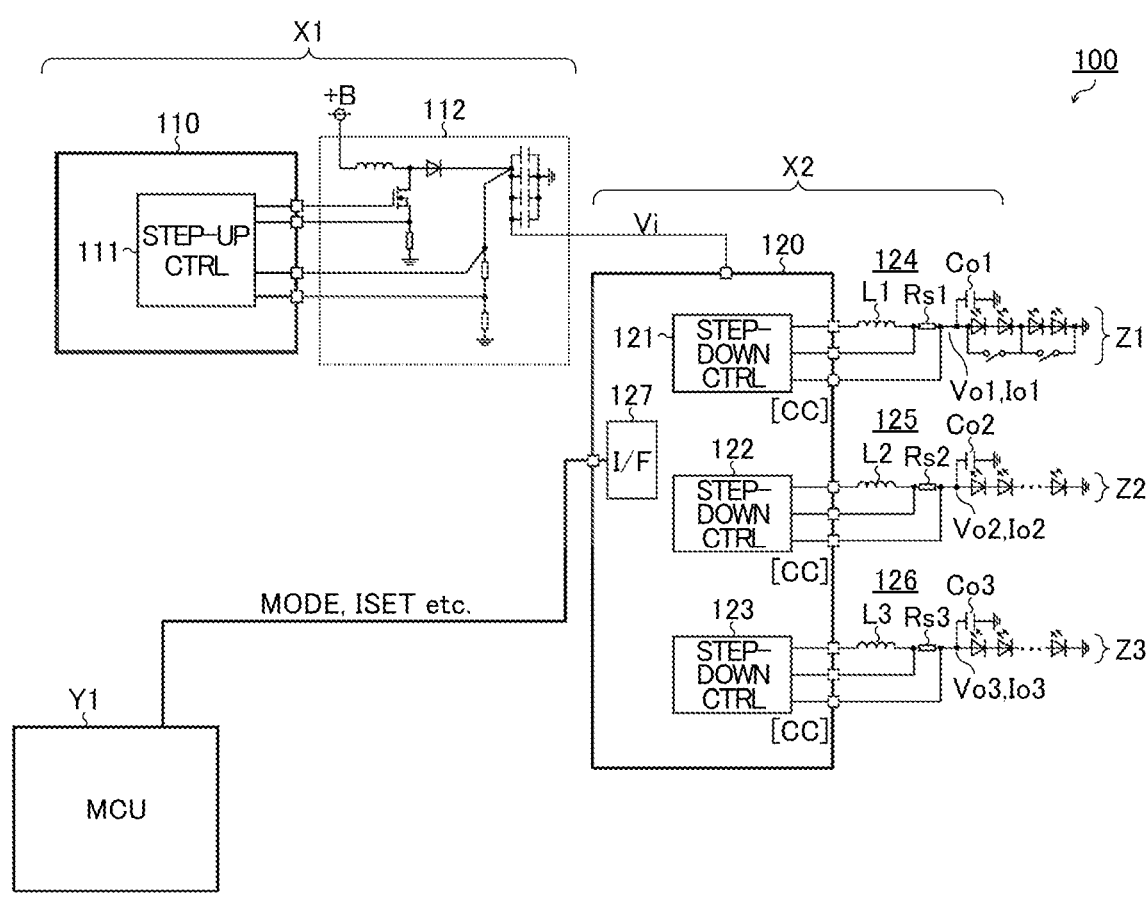
FIG. 8 is a diagram showing an LED lighting device according to a third embodiment.

FIG. 8 is a diagram showing an LED lighting device according to a third embodiment. The LED lighting device 100 of the third embodiment is for comprehensively driving the lighting of various LED lamps mounted on a vehicle, and includes a boost switching power supply X1, a buck switching power supply X2, a control unit Y1 (e.g., microcontroller unit), and LED loads Z1 to Z3.

The boost switching power supply X1 includes, as a principal control agent, a boost DC/DC controller IC 110. The boost DC/DC controller IC 110, using a boost controller 111 incorporated in it, drives a boost output stage 112 externally connected to it to boost a battery voltage +B to generate a desired input voltage Vi. While in the diagram the boost output stage 112 employs diode rectification, it may instead employ synchronous rectification.

The buck switching power supply X2 includes, as a principal control agent, a buck DC/DC controller IC 120 of a multioutput type (in the diagram, a three-channel output type). The buck DC/DC controller IC 120, using buck controllers 121 to 123 incorporated in it, drives the buck output stages 124 to 126 respectively.

In terms of what is shown in the diagram, the buck controller 121 of the first channel drives the buck output stage 124, which is composed of an inductor L1, a capacitor Co1, and a sense resistor Rs1, and thereby generates from the input voltage Vi an output voltage Vo1 and an output current Io1 to feed them to the LED load Z1. The LED load Z1 can be high-beam and low-beam lamps of a vehicle.

Likewise, the buck controller 122 of the second channel drives the buck output stage 125, which is composed of an inductor L2, a capacitor Co2, and a sense resistor Rs2, and thereby generates from the input voltage Vi an output voltage Vo2 and an output current Io2 to feed them to the LED load Z2. The LED load Z2 can be direction indicator lamps of a vehicle.

Likewise, the buck controller 123 of the third channel drives the buck output stage 126, which is composed of an inductor L3, a capacitor Co3, and a sense resistor Rs3, and thereby generates from the input voltage Vi an output voltage Vo3 and an output current Io3 to feed them to the LED load Z3. The LED load Z3 can be DRLs (daytime running lamps) or position lamps of a vehicle.

The buck controllers 121 to 123 can each employ a circuit configuration similar to that of the LED driver IC 10 of the first embodiment (FIG. 5) or the second embodiment (FIG. 7) described previously. While the diagram deals with an example where three-channel buck controllers 121 to 123 are integrated in a single buck DC/DC controller IC 120, the buck controllers 121 to 123 may each be formed as an independent semiconductor device.

The buck DC/DC controller IC 120 includes an interface 127 (such as an SPI) for serial bidirectional communication with outside the IC. With this configuration, it is possible, between the buck DC/DC controller IC 120 and the control unit Y1 via the interface 127, to exchange various kinds of information on each of the buck controllers 121 to 123 (such as the mode switch signal MODE and the digital dimming signal ISET mentioned previously, as well as a PWM dimming signal, a frequency setting signal, an LED fault dialog, or the like). Thus, the control unit Y1 can comprehensively control the buck controllers 121 to 123 of all the three channels.

In terms of what is shown in the diagram, the buck controllers 121 to 123 are each set to the constant-current control mode (MODE=CC) according to the mode switch signal MODE fed to it via the interface 127. Accordingly, the buck controllers 121 to 123 perform bottom-detection fixed-on-time output feedback control (constant-current control) such that the output currents Io1 to Io3 are each equal to a predetermined target value.

The LED load Z1 includes a plurality of switches connected in parallel with a plurality of LED elements and can, by turning on and off those switches, freely change the number of stages of LED elements connected in series (i.e., the number of LED elements lit). Thus, in the LED load Z1 being lit, the number of LED elements lit (hence the voltage across the LED load Z1) can change abruptly.

Thus, to keep the LED load Z1 lit with constant brightness, it is necessary to quicken the response of the buck controller 121 to continue to output a constant output current Io1 despite variation of the number of LED elements lit. With this taken into account, a preferred scheme for the output feedback control by the buck controller 121 is a non-linear control scheme with fast response (e.g., a bottom-detection fixed-on-time scheme as described previously). Needless to say, the same is true with the buck controllers 122 and 123.

LED Lighting Device (Fourth Embodiment)

Figure 9:
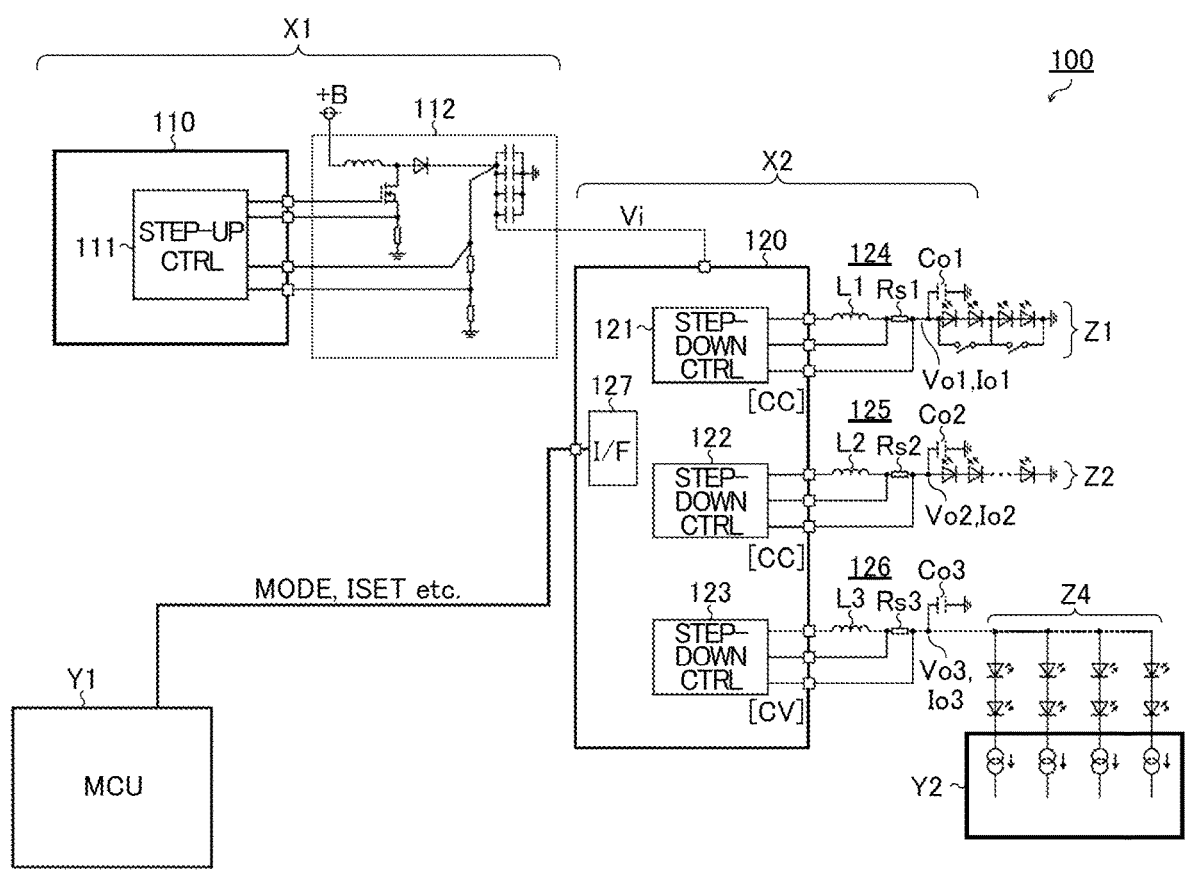
FIG. 9 is a diagram showing an LED lighting device according to a fourth embodiment.

FIG. 9 is a diagram showing an LED lighting device according to a fourth embodiment. The LED lighting device 100 of the fourth embodiment is based on the third embodiment (FIG. 8) described previously, but differs from it in that the LED load Z3 mentioned previously is replaced with an LED load Z4 and that it additionally includes a constant current controller Y2.

The LED load Z4 includes a plurality of LED strings connected in parallel, and the driving current that pass through each of them is subject to constant-current control by the constant current controller Y2. The LED load Z4 can be animation lamps of a vehicle.

Accordingly, the buck controller 123 is set to the constant-voltage control mode (MODE=CV) according to the mode switch signal MODE for the third channel that is fed to the buck controller 123 via the interface 127. Thus, in the buck controller 123, bottom-detection fixed-on-time output feedback control (constant-voltage control) is performed such that the output voltage Vo3 is equal to a predetermined target value.

As described above, the target of the output feedback controller by each of the buck controllers 121 to 123 can be switched individually.

LED Lighting Device (Fifth Embodiment)

Figure 10:
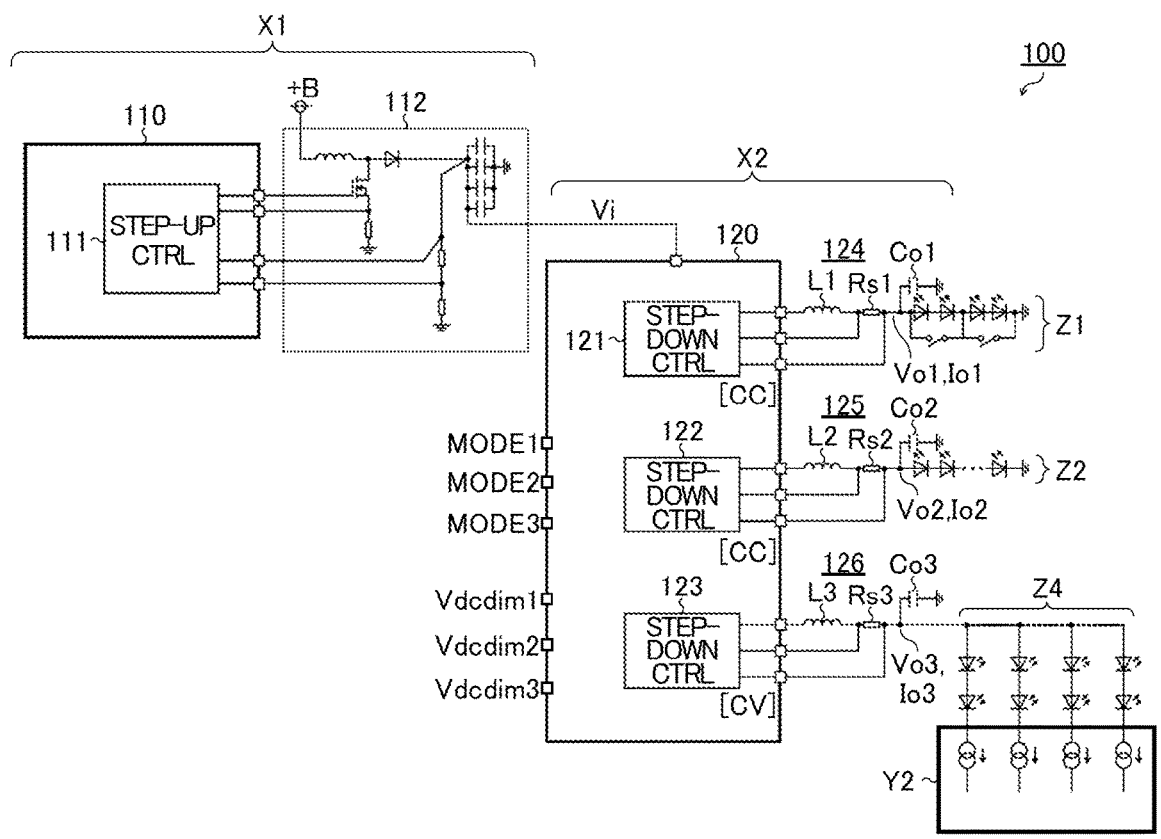
FIG. 10 is a diagram showing an LED lighting device according to a fifth embodiment.

FIG. 10 is a diagram showing an LED lighting device according to a fifth embodiment. The LED lighting device 100 of the fifth embodiment is based on the third embodiment (FIG. 8) or the fourth embodiment (FIG. 9) described previously, but differs from them in that the interface 127 previously described is omitted and that it instead includes external terminals for receiving mode switch signals MODE1 to MODE3 and analog dimming signals Vdcdim1 to Vdcdim3 for different channels.

In this way, in a case where space is available for an extra number of external terminals, the mode switch signal MODE and the analog dimming signal Vdcdim mentioned previously can be fed in directly from outside the IC.

Overview

To follow is an overview of the various embodiment described herein.

For example, according to one aspect of what is disclosed herein, a semiconductor device is configured to function as a component of a switching power supply, and includes: a current sense signal generator configured to generate a current sense signal by amplifying a sense voltage corresponding to the output current of the switching power supply; a voltage sense signal generator configured to generate a voltage sense signal corresponding to the output voltage of the switching power supply; a selector configured to output as a selected sense signal one of the current sense signal and the voltage sense signal according to a mode switch signal; and an output feedback controller configured to control the driving of the switching power supply based on the selected sense signal. (A first configuration.)

In the semiconductor device of the first configuration described above, the output feedback controller may include: an error amplifier configured to generate an error signal corresponding to the selected sense signal; a slope signal generator configured to generate from the current sense signal or the sense voltage a slope signal containing an alternating-current component of the output current; a comparator configured to generate a set signal by comparing the error signal with the slope signal; an on-time setter configured to generate a pulse in a reset signal at the lapse of a predetermined on-time after the timing at which a pulse is generated in the set signal; a controller configured to generate a control signal according to the set signal and the reset signal; and a driver configured to generate a driving signal for an output stage according to the control signal. (A second configuration.)

The semiconductor device of the first configuration described above may further include a sense voltage adjuster configured to adjust the sense voltage according to an output setting signal. (A third configuration.)

In the semiconductor device of the third configuration described above, in a constant-current control mode, the output setting signal may be fed to the sense voltage adjuster and the current sense signal in a differential form may be fed to the error amplifier; in a constant-voltage control mode, the voltage sense signal and the output setting signal may be fed to the error amplifier. (A fourth configuration.)

In the semiconductor device of the second configuration described above, in a constant-current control mode, the current sense signal and the output setting signal may be fed to the error amplifier; in a constant-voltage control mode, the voltage sense signal and the output setting signal may be fed to the error amplifier. (A fifth configuration.)

The semiconductor device of any of the third to fifth configurations described above may further include: an interface configured to perform communication with outside the semiconductor device; and a DAC configured to convert a digital register value set via the interface into the output setting signal in an analog form. (A sixth configuration.)

The semiconductor device of any of the third to fifth configurations described above may further include an external terminal configured to receive the output setting signal in an analog form. (A seventh configuration.)

In the semiconductor device of any of the first to seventh configurations described above, the voltage sense signal generator may be a voltage divider configured to generate the voltage sense signal by dividing the output voltage. (An eighth configuration.)

For example, according to another aspect of what is disclosed herein, a switching power supply includes: the semiconductor device of any of the first to eighth configurations described above; and a sense resistor configured to convert the output current into the sense voltage. (A ninth configuration.)

For example, according to yet another aspect of what is disclosed herein, a lighting device includes: the switching power supply of the ninth configuration described above; and a light-emitting element configured to emit light by being supplied with the output current. (A tenth configuration.)

<Further Modifications>

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope equivalent in significance to what is claimed.

The invention claimed is:

1. A semiconductor device configured to function as a component of a switching power supply, comprising:
   a current sense signal generator configured to generate a current sense signal by amplifying a sense voltage corresponding to an output current of the switching power supply;
   a voltage sense signal generator configured to generate a voltage sense signal corresponding to an output voltage of the switching power supply;
   a selector configured to output as a selected sense signal one of the current sense signal and the voltage sense signal according to a mode switch signal; and
   an output feedback controller configured to control driving of the switching power supply based on the selected sense signal, wherein the output feedback controller includes
   an error amplifier configured to generate an error signal corresponding to the selected sense signal,
   a slope signal generator configured to generate from the current sense signal or the sense voltage a slope signal containing an alternating-current component of the output current, and
   a comparator configured to generate a set signal by comparing the error signal with the slope signal.

2. The semiconductor device according to claim 1, wherein the output feedback controller further includes:
   an on-time setter configured to generate a pulse in a reset signal at a lapse of a predetermined on-time after a timing at which a pulse is generated in the set signal;
   a controller configured to generate a control signal according to the set signal and the reset signal; and
   a driver configured to generate a driving signal for an output stage according to the control signal.

3. The semiconductor device according to claim 2, further comprising:
   a sense voltage adjuster configured to adjust the sense voltage according to an output setting signal.

4. The semiconductor device according to claim 3, wherein
   in a constant-current control mode, the output setting signal is fed to the sense voltage adjuster and the current sense signal in a differential form is fed to the error amplifier, and
   in a constant-voltage control mode, the voltage sense signal and the output setting signal are fed to the error amplifier.

5. The semiconductor device according to claim 2, wherein
   in a constant-current control mode, the current sense signal and the output setting signal are fed to the error amplifier, and
   in a constant-voltage control mode, the voltage sense signal and the output setting signal are fed to the error amplifier.

6. The semiconductor device according to claim 3, further comprising:
   an interface configured to perform communication with outside the semiconductor device; and
   a DAC (digital-to-analog converter) configured to convert a digital register value set via the interface into the output setting signal in an analog form.

7. The semiconductor device according to claim 3, further comprising:
   an external terminal configured to receive the output setting signal in an analog form.

8. The semiconductor device according to claim 1, wherein
   the voltage sense signal generator is a voltage divider configured to generate the voltage sense signal by dividing the output voltage.

9. A switching power supply, comprising:
   the semiconductor device according to claim 1; and
   a sense resistor configured to convert the output current into the sense voltage.

10. A lighting device, comprising:
    the switching power supply according to claim 9; and
    a light-emitting element configured to emit light by being supplied with the output current.

* * * * *